(12) United States Patent
Amstutz

(10) Patent No.: US 6,272,653 B1
(45) Date of Patent: Aug. 7, 2001

(54) METHOD AND APPARATUS FOR BUILT-IN SELF-TEST OF LOGIC CIRCUITRY

(75) Inventor: Kenneth D. Amstutz, Austin, TX (US)

(73) Assignee: Intrinsity, Inc., Austin, TX (US)

( * ) Notice: Subject to any disclaimer, the term of this patent is extended or adjusted under 35 U.S.C. 154(b) by 0 days.

(21) Appl. No.: 09/191,813

(22) Filed: Nov. 13, 1998

Related U.S. Application Data

(60) Provisional application No. 60/065,558, filed on Nov. 14, 1997.

(51) Int. Cl.$^7$ ................................................ G01R 31/28
(52) U.S. Cl. ........................ 714/724; 714/728; 714/733
(58) Field of Search ........................... 714/724, 733, 714/728, 738, 739

(56) References Cited

U.S. PATENT DOCUMENTS

| | | |
|---|---|---|
| 4,688,223 | 8/1987 | Motika et al. . |
| 5,043,988 | 8/1991 | Brglez . |
| 5,239,262 | 8/1993 | Grutzner et al. . |
| 5,369,648 | * 11/1994 | Nelson .................................. 714/739 |
| 5,570,375 | * 10/1996 | Tsai et al. ............................. 714/727 |
| 5,574,733 | 11/1996 | Kim . |
| 5,638,988 | 6/1997 | Krick et al. . |

OTHER PUBLICATIONS

Cattell, et al.; One–Dimensional Linear Hybrid Cellular Automata: Their Synthesis, Properties, and Applications in VLSI Testing; http://csr.uvic.ca/home/mserra/Publications/CApaper.pdf.

* cited by examiner

Primary Examiner—Phung M. Chung
(74) Attorney, Agent, or Firm—Booth & Wright, L.L.P.; Matthew J. Booth; Karen S. Wright

(57) ABSTRACT

The present invention comprises a method and apparatus for built-in self-test of logic circuitry for logic under test. The logic under test comprises a plurality of test points, each test point having a plurality of nodes. The test circuitry comprises a linear finite state machine. The linear finite state machine generates subsequent states that are non-sequential, pseudorandom binary numbers stochastically determined by a characteristic polynomial of the linear finite state machine. Moreover, the contents of the linear finite state machine are readable or writable via scan. The preferred implementation also comprises a test data bus coupled between the logic under test and the linear finite state machine. The test data bus is configured to convey data in parallel fashion between the linear finite state machine and the selected test point of the plurality of test points.

32 Claims, 5 Drawing Sheets

METHOD AND APPARATUS FOR BUILT-IN SELF-TEST OF LOGIC CIRCUITRY

This application claims the benefits of the earlier filed U.S. Provisional Application Ser. No. 60/065,558, filed Nov. 14, 1997, which is incorporated by reference for all purposes into this application.

BACKGROUND OF THE INVENTION

1. Field of the Invention

The present invention relates to digital logic circuitry, and more specifically to built-in self test of digital logic circuitry.

2. Description of the Related Art

Testing of integrated circuits (ICs) has become vitally important in the electronics industry. Typically, ICs are tested by use of automatic test equipment (ATE) and mechanical handling equipment, which automates the testing process. The controllability of test sequences, and of conditions such as voltage and temperature, coupled with the ability to archive and analyze test results, offers great convenience in the manufacturing and test of ICs.

This approach, however, is not without its problems. ATE is generally expensive because it is complex. To maximize their ATE investment, companies want their ATE to interface to ICs of different types. This requires the development of custom interface hardware between the ATE and the IC under test. The interface hardware introduces parasitics and time delays that can have a detrimental effect on test efficiency and accuracy.

Moreover, ATE requires the development of specialized software that is specific to the IC under test. This software comprises sequences of input stimuli, sequences of corresponding output responses, and the order and conditions under which these sequences are applied to the IC under test.

Built-in self-test (BIST) is commonly practiced in the electronics industry as a means to circumvent some of these problems. By placing circuitry on chip to apply the test sequences that would otherwise be applied by the ATE, BIST provides a solution to the problems posed by test interface hardware. BIST potentially enables the testing of the chip at full operating frequencies, because the BIST circuitry is fabricated of the same technology as the circuit under test, and can be placed immediately adjacent to the circuitry under test. BIST also potentially enables an IC to be tested in situ following the integration of the IC into a system-level product, as the test algorithm resides on-chip rather than with the ATE.

Any BIST circuitry increases the area, and hence the cost, of the IC die. As a result, the degree of BIST implementation, and the increased test coverage achieved by such implementation, must be traded off against the increased die area and associated cost. The degree of test coverage achieved through BIST is a function of the die area consumed by BIST. The current economics of the IC industry require that the ratio of circuitry under test to BIST circuitry must remain relatively high. Consequently, typical BIST implementations control and observe only the primary inputs and outputs of a relatively large block of logic. Further analysis and testing must then be conducted without BIST to pinpoint BIST-identified problems.

The conventional approach of using ATE to apply test sequences that have been generated off-chip suffers from this problem to an even greater degree. This conventional approach permits control and observability only at the chip boundary, which is limited to the primary inputs and primary outputs of the chip. BIST has eased, but not solved completely, the problem of limited node access.

The problem of poor access to interior circuit nodes, encountered when using ATE to drive primary inputs and strobe primary outputs of an IC, has been commonly addressed in the industry through the implementation of a technique known as "scan access." Scan access refers broadly to the use of specialized serial shift registers ("scan registers") to deliver stimulus vectors from a stimulus pattern generator to circuit nodes of interest, and to retrieve response data from circuit nodes of interest for analysis. Scan registers function as normal synchronous registers and latch data propagating through the computational logic. However, scan registers can also be interconnected in such a way as to allow propagation of data directly from register to register upon assertion of BIST control signals or clocks, thereby bypassing any computation logic between the registers. This provides a means whereby stimulus data may be transported directly to internal circuit nodes without propagating through computational logic, and whereby response data may be retrieved directly from internal circuit nodes without propagating through computational logic, thus allowing designers to isolate sections of logic for testing. By way of illustration, consider two partitions of logic circuitry, Partition 1 and Partition 2, residing on a single hypothetical chip without scan access. Assume that the circuitry is configured such that only Partition 1 is directly accessible from primary inputs of the chip and only Partition 2 is coupled to primary outputs of the chip. Assume further that the inputs of Partition 2 are driven only by the outputs of Partition 1. To test Partition 2, designers must compute the particular stimulus vectors that, when placed on the inputs to Partition 2, exercise the faults of interest within Partition 2. However, to apply those stimulus vectors to Partition 2, designers must also map the Partition 2 stimulus vectors backwards through the logic of Partition 1 to obtain the corresponding primary inputs stimulus vectors. In many cases this mapping may be logically impossible, rendering certain faults within Partition 2 untestable. The implementation of scan access, however, would place scan registers at the boundary between Partitions 1 and 2, interconnected in such a way that stimulus vectors for Partition 2 could be serially shifted directly onto the inputs of Partition 2 without passing through Partition 1, enhancing the testability of Partition 2.

A similar benefit is realized with respect to the retrieval of response data. The implementation of scan access as described above would also enable the direct retrieval of response data from the outputs of Partition 1 without passing through Partition 2. This obviates the need to map the output response vectors of Partition 1 through the logic of Partition 2 and enhances the testability of Partition 1.

The benefit of scan access increases as the proportion of circuit nodes otherwise inaccessible from primary inputs and outputs increases. "Full scan" refers to an implementation of scan access wherein every register on a chip is accessible through scan. "Partial scan" refers to an implementation of scan access wherein some subset of the registers on a chip are accessible through scan.

Conventional scan access, i.e., propagating data through a long chain of interconnected scan registers, is inherently serial in nature. The number of clock cycles needed to load or unload the scan chain is equal to the number of registers in the chain. Gaining access to internal nodes is therefore accomplished only at the cost of very long test times. Scan access also does not relieve the burden of test software development. Stimulus and response patterns must still be computed off-chip, prior to test time.

Alternate scan architectures such as random access scan have been used to remedy the test time problem caused by the serial nature of scan access. Random access scan, mploys individually-addressable registers rather than registers connected in a fixed order. This adds greater flexibility to the order in which registers may be accessed, but reduces overall test time only when writing or reading some subset of the registers. Random access scan does not decrease the total number of clock cycles needed to write or read all registers.

SUMMARY OF THE INVENTION

The present invention comprises both logic under test and test circuitry The logic under test comprises a plurality of test points, each test point having a plurality of nodes. The test circuitry comprises a linear finite state machine (LFSM). The LFSM generates subsequent states that are non-sequential, pseudorandom binary numbers stochastically determined by a characteristic polynomial of the LFSM. In some embodiments, the LFSM is either a linear hybrid cellular automata, a tree structured linear cellular automata, or a linear feedback shift register, and the state-to-state transitions of the LFSM are uniquely associated with a characteristic polynomial that may be primitive and irreducible. Moreover, the contents of the LFSM are readable or writable via scan. The preferred implementation also comprises a test data bus coupled between the logic under test and the LFSM. The test data bus is configured to convey data in parallel fashion between the LFSM and the selected test point of the plurality of test points.

In some embodiments, two LFSMs, one configured as a pseudorandom pattern generator and the other configured as a multiple input response compactor, are included. Other embodiments include a single LFSM configurable as a pseudorandom pattern generator in one mode and as a multiple input response compactor in another mode.

In some embodiments, one or more seed storage buffers (SSBs) are coupled to the LFSM in parallel fashion. The SSBs are configured to archive data from, and/or to restore data to, the LFSM. In the embodiments having two LFSMs, the second SSB is coupled to the second LFSM. The SSBs are preferably coupled in parallel fashion.

A test point address counter (TPAC) is included in some embodiments, configured to select a test point in the logic under test, gating the selected test point to the test data bus. A BIST control unit is also included, and is configured to control whether data is written to or read from the selected test access point, and to control sequencing of the TPAC and the LFSM, among other functions.

BRIEF DESCRIPTION OF THE DRAWINGS

To further aid in understanding the invention, the attached drawings help illustrate specific features of the invention and the following is a brief description of the attached drawings.

DETAILED DESCRIPTION OF THE INVENTION

The present invention comprises a method and apparatus for built-in self-test (BIST) of logic circuitry. This disclosure describes numerous specific details that include specific structures, circuits, and logic functions in order to provide a thorough understanding of the present invention. One skilled in the art will appreciate that one may practice the present invention without specific details.

The present invention is a novel approach to built-in self-test. Each cell of a pattern generator uniquely stimulates multiple nodes of a logic circuit under test, and each cell of a response compactor retrieves unique response data from multiple nodes of a logic circuit under test. Stimulus generation and response compaction are accomplished at a fraction of the cost, both financial and in terms of die area, of conventional BIST operation. The delivery of stimuli, and retrieval of response data, from nodes throughout the circuit under test is far more efficient due to the parallelism of the present invention, thereby reducing test times.

The present invention includes autonomous operation, reducing the need for external test pattern generation. Node coverage is enhanced relative to conventional BIST implementations, as any node which would otherwise by accessible via conventional scan access may be addressed. The present invention achieves topological coverage comparable to scan access, with the autonomy and efficiency of BIST.

Figure 1A:
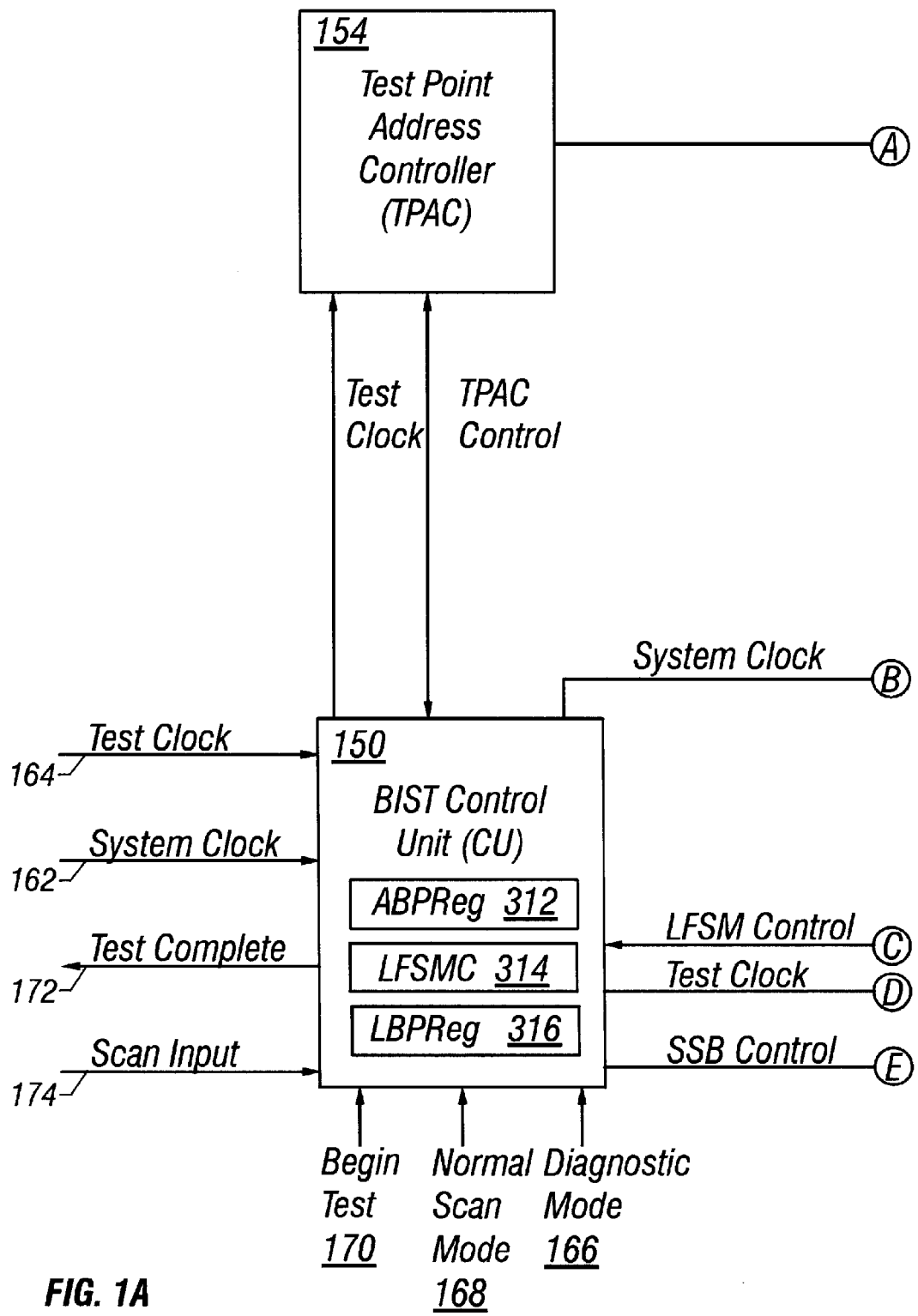
FIG. 1 block diagram of one embodiment of the present invention.
Figure 1B:
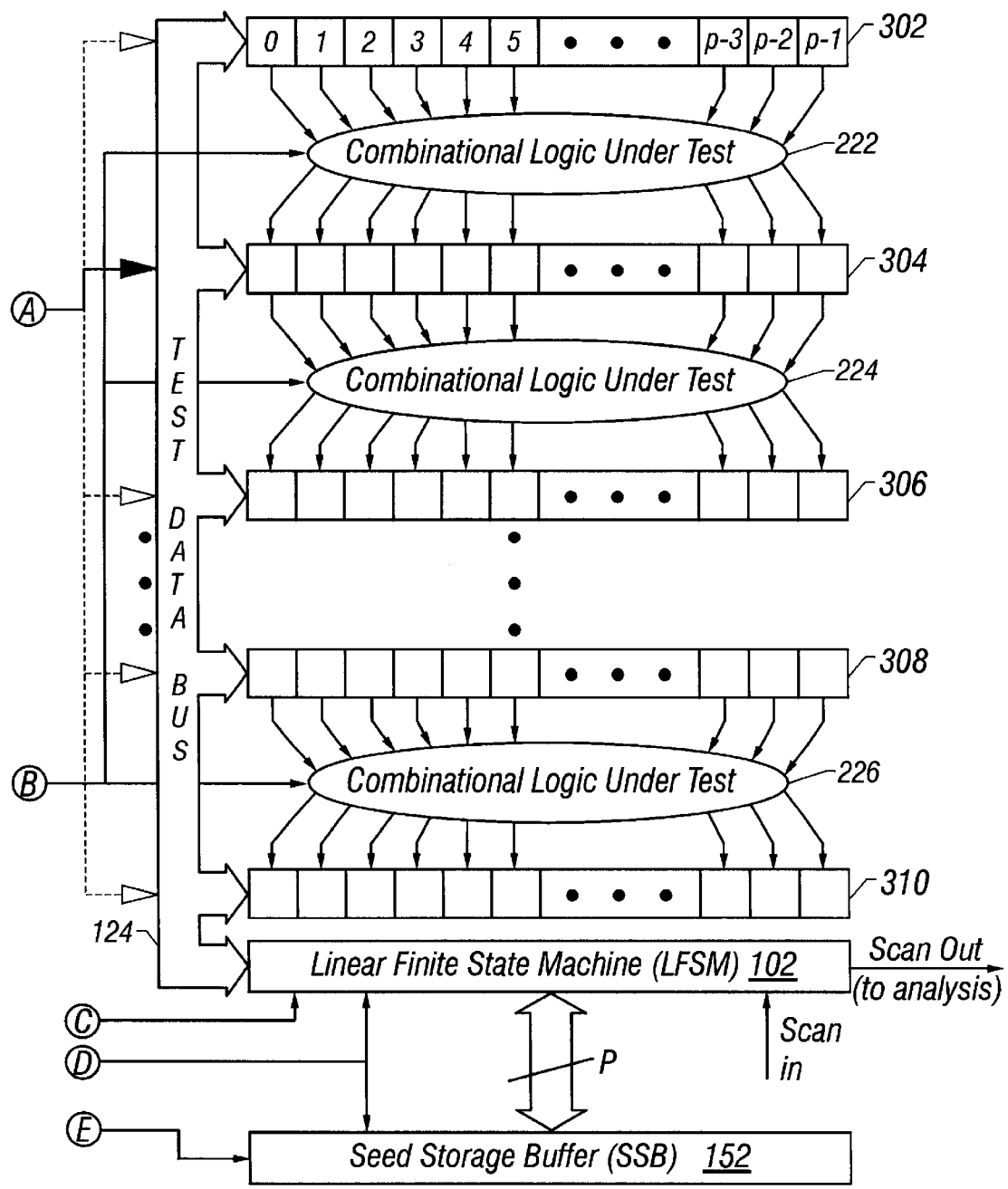

Referring now to FIG. 1, a BIST Control Unit 150 is shown, coupled to logic under test (LUT) 222, 224, 226; a linear finite state machine (LFSM) 102; a seed storage buffer (SSB) 152; and a Test Point Address Controller (TPAC) 154. The BIST Control Unit 150 controls the mode of operation of the LFSM 102, archives and restores the contents of LFSM 102 to and from SSB 152, and advances or resets the TPAC 154. The TPAC 154 is coupled to the BIST Control Unit 150, and to the test data bus 124.

The SSB 152 is coupled to the LFSM 102 in parallel fashion, and with bit-to-bit correspondence such that the nth bit of the SSB 152 is coupled to the nth bit of the LFSM 102. The LFSM 102 is coupled via the test data bus 124 to the test points 302, 304, 306, 308 and 310. One skilled in the art will recognize that any number of test points and logic blocks may be included and that the particular number of blocks shown are for exemplary purposes. LFSM 102 and SSB 152 may be duplicated in one embodiment such that one LFSM 102 and one SSB 152 operate during stimulus generation (write mode) and the other LFSM and SSB operate during response compaction (read mode).

Structure of the Linear Finite State Machine (LFSM)

Those skilled in the art recognize that LFSMs are commonly used as pseudorandom pattern generators (PRPGs) and as test response signature compactors. LFSMs are advantageous in that they operate autonomously, reducing or eliminating the need for direct interaction between the logic under test and a test system external to the IC. Since they can be fabricated in the same technology as the logic under test, they potentially can operate at full frequency relative to the logic under test, reducing or eliminating bandwidth limitations posed by test systems or interface hardware external to the IC. As shown in the example 4-bit LFSM cycle diagram shown in FIG. 2, an n-bit LFSM can generate $2^n-1$ unique binary numbers.

Figure 3:
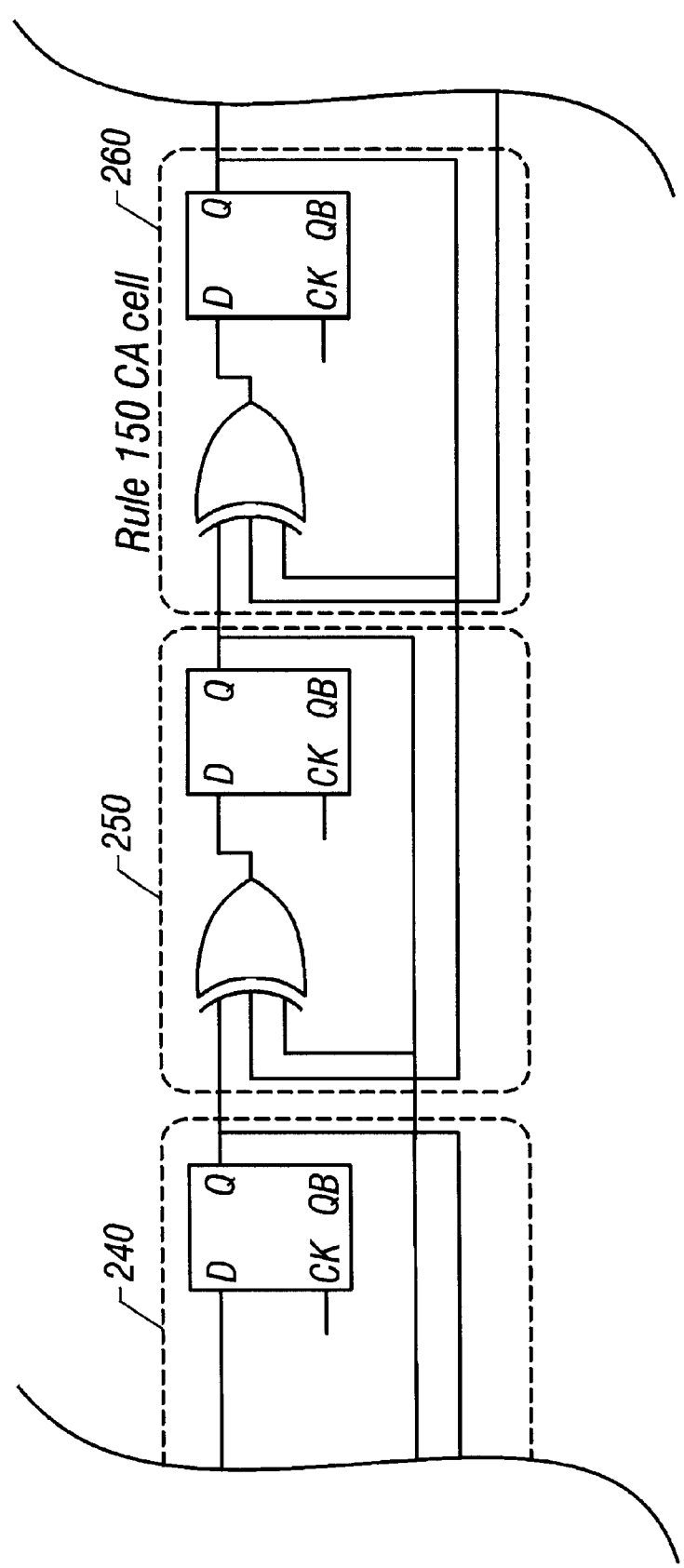
FIG. 3 shows a circuit configuration of a standalone linear hybrid cellul ar automata (LHCA), according to one embodiment of the present invention.

The LFSM 102 of the described embodiment is a null-boundary Linear Hybrid Cellular Automata (LHCA), an example of which is shown in FIG. 3. In other embodiments, the LFSM 102 is a tree-structured linear cellular automata (TLCA), a linear feedback shift register (LFSR), or other form of LFSM. The contents of the LFSM 102 may be read or written via scan.

Figure 2:
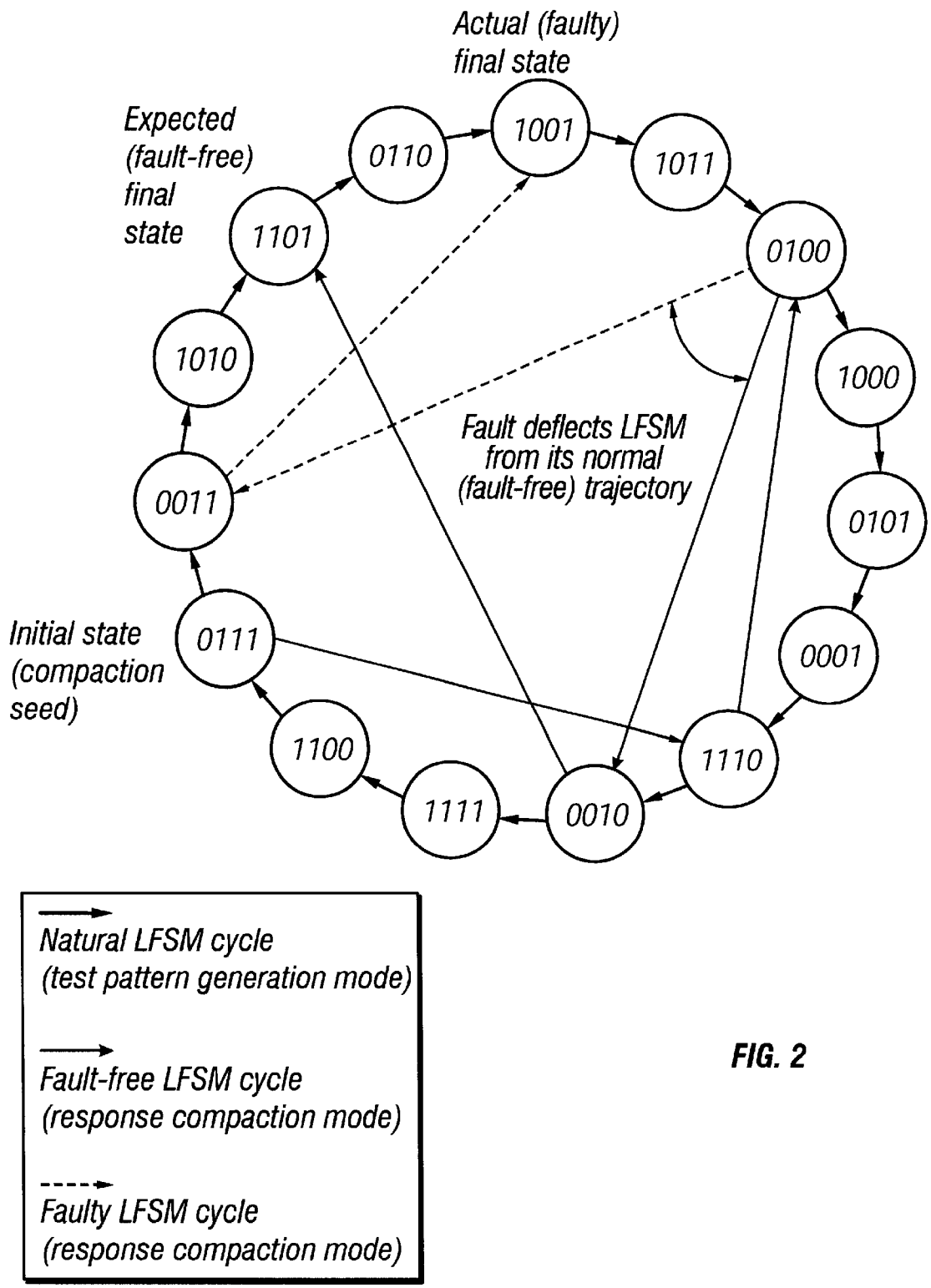
FIG. 2 shows an exemplary 4-bit LFSM cycle diagram for an LFSM operating in the absence of injected response data and in the presence of injected response data, for both fault free and faulty cases.
Figure 4:
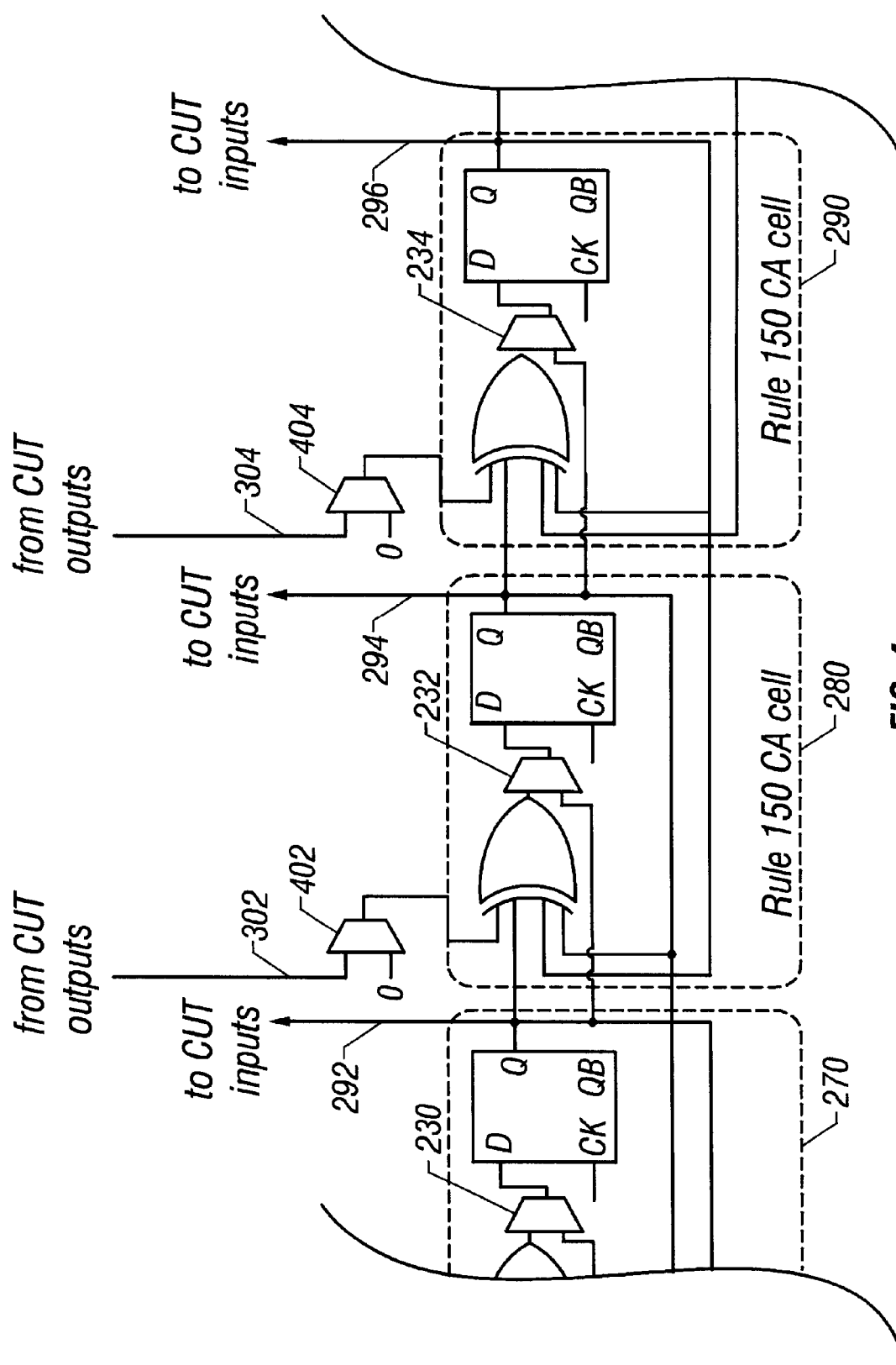
FIG. 4 shows a circuit configuration of a LHCA used as a pattern generator and response compactor, according to one embodiment of the present invention.

The state-to-state transitions of the LFSM 102 are uniquely associated with a characteristic polynomial, which is preferably but not necessarily primitive and irreducible. Moreover, the state-to-state transitions are stochastically determined by the characteristic polynomial of the LFSM. The state diagram of the LFSM is generally a simple closed loop. However, when response data read from a test point are deliberately injected into the transition sequence by means of multiplexers and Exclusive-Or gates, as shown in FIG. 2 and FIG. 4, the state-to-state transitions of the LFSM are a stochastic function of both the characteristic polynomial and of the response data being read from the test point. The natural data so injected deflect the transition sequence of the LFSM from its natural trajectory through its state space.

Seed Storage Buffer (SSB)

SSB 152 is coupled to the LFSM 102 in parallel fashion such that the nth bit of the SSB 152 is coupled to the nth bit of the LFSM 102. The LFSM 102 is coupled via the test data bus 124 to the test points 302, 304, 306, 308, and 310. One skilled in the art will recognize that any number of test points and logic blocks may be included and that the blocks shown are for exemplary purposes. Additionally, SSB 152 comprises a register capable of archiving and restoring the contents of the LFSM 102.

Test Point Address Controller (TPAC)

TPAC 154 is coupled to the BIST Control Unit 150, and to the test data bus 124. TPAC 154 is a finite state machine whose preferred embodiment is a simple binary counter. The output of the TPAC 154 is a binary address that can be decoded to select one test point coupled to the test data bus 124. TPAC 154 can be reset to a known state by the BIST Control Unit 150. The known state is preferably the zero state.

The Test Data Bus

The test data bus 124 couples the LFSM 102 to the test point selected by the TPAC 154. The test data bus 124 conveys stimulus data from the LFSM 102 to the test point selected by the TPAC 154 during a write operation, and conveys response data from the selected test point to the LFSM 102 during a read operation.

Logic Under Test

The logic under test includes several logic blocks. The logic blocks may be clocked by a common system clock which is gated by the BIST Control Unit 150, or in other embodiments by several independent system clocks each gated by the BIST Control Unit 150. The logic blocks are shown as combinational in FIG. 1; however, one skilled in the art will understand that sequential logic may be substituted for any or all logic blocks. The logic under test is also sometimes referred to herein as the circuit under test (CUT).

When the logic under test receives a system clock, response data is latched by test points coupled to the outputs of the logic under test. "Response data" refers to the computational results produced by the combinational or sequential logic block in response to input stimulus data at its inputs.

Referring now to FIG. 3, a circuit configuration of a standalone LHCA is shown. The standalone LHCA includes several cells in sequence. Each of the cells includes a memory element such as a D-type flip-flop. The cells also include an exclusive-OR gate that performs a feedback function. As recognized by one skilled in the art, a Rule 150 CA cell is defined such that the exclusive-OR gate in the nth cell receives data from three cells: the (n−1)th cell, the nth cell, and the (n+1) cell. A Rule 90 CA cell is defined such that the exclusive-OR gate in the nth cell receives data from two cells: the (n−1)th cell and the (n+1)th cell. The standalone LHCA shown in FIG. 3 includes several Rule 150 CA cells 240–260. In some embodiments, the LHCA is null-boundary. An LHCA is null boundary if, when the nth cell is the last cell in the LHCA, the value of the (n+1)th cell is taken as zero, and if, when the nth cell is the first cell in the LHCA, the value of the (n−1)th cell is taken as zero.

Referring now to FIG. 4, a circuit configuration of a LHCA used as a pattern generator and response compactor is shown. Although FIG. 4 shows several Rule 150 CA cells 270–290, Rule 90 CA cells are also likely to be included in such an LHCA implementation. Each Rule 150 CA cell 270–290 includes an exclusive-OR gate and a memory element such as a D-type flip-flop, as in FIG. 3. The LHCA of FIG. 4, like the LHCA of FIG. 3, incorporates the noninverting feedback logic in the form of exclusive-OR gates. However, the LHCA of FIG. 4 also shows the interfaces to the test data bus 124, and the multiplexers that allow serial scan access. For example, FIG. 4 shows the outputs 292, 294, and 296 to a CUT. FIG. 4 also shows inputs 302 and 304 received from the test points 302 and 304 of the CUT.

As shown in FIG. 4, the LHCA may also contain multiplexers to select modes of operation. For example, the LHCA in FIG. 4 includes a read mode, a write mode, and a shift mode. During read mode, multiplexers 230, 232, and 234 select CUT outputs and gate the CUT outputs to exclusive-OR gates such that CUT outputs influence the next state of the LHCA. In write mode, as in all modes, the value of the LHCA is provided to the CUT inputs. In shift mode, multiplexers 230, 232, and 234 bypass the feedback logic, providing instead the (n−1)th bit value to each nth cell and multiplexers 402 and 404 disable feedback from the circuit under test (CUT).

Returning to FIG. 1, the BIST Control Unit 150 has the following input signals: Begin Test 170, System Clock 162, Test Clock 164, Diagnostic Mode 166, Normal Scan Mode 168, and Scan Input 174. The BIST Control Unit 150 generates the Test Complete output 172. The BIST Control Unit 150 also gates the Test Clock 164 to the TPAC 154, LFSM 102, and SSB 152, and gates the System Clock 162 to the logic under test 222, 224, and 226. The BIST Control Unit 150 also contains a number of registers and counters used mainly during Diagnostic Mode: Address Break Point Register (ABPReg) 312, LFSM Counter (LFSMC) 314, and LFSM Break Point Register (LBPReg) 316.

The LFSMC 314 functions as a resettable binary counter which keeps track of how many times the SSB 152 has been updated. ABPReg 312 and LBPReg 316 function scan-programmable registers, whereby the user may specify breakpoints at which the BIST Control Unit 150 will halt the TPAC 154 and LFSM 102, for diagnostic purposes. Registers ABPReg 312 and LBPReg 316 are scan programmable through the BIST Control Scan Input 174.

Operation

The test circuitry of the described embodiment is capable of several modes. The test circuitry enters BIST mode upon assertion of a designated Begin Test signal 170, which may or may not occur automatically upon processor reset, if the Scan Mode input 168 and Diagnostic Mode input 166 of the BIST Control Unit 150 are deasserted. A BIST execution pass begins with a resetting or presetting of BIST circuitry and continues, operating autonomously, until terminated by an external event.

The BIST mode has two sub-modes: a write mode and a read mode. Each pass of BIST includes a seeding of the LFSM 102 and resetting of the TPAC 154; a first inner loop in "write sub-mode" in which a stimulus is written to each test point in the logic under test; a single system clock pulse, allowing data which has propagated through the logic under test to be captured at a subsequent test point; optionally, another seeding of the LFSM 102 and resetting of the TPAC 154; and a second inner loop in "read sub-mode" in which response data is read from each test point in the logic under test and multiplexed into the LFSM 102.

Upon entering BIST mode initially, the LFSM 102 is seeded (preset to a predetermined state) and is then said to contain the "Pattern Generation Seed." The TPAC 154 is also preset to an initial state, preferably the zero state. Upon the seeding of the LFSM 102, in some embodiments, the contents of the LFSM 102 are stored in the SSB 154.

After the LFSM 102 is seeded and the TPAC 154 is preset, the test circuitry (including the LFSM 102 and the TPAC 154) enters write mode, and iterates through the TPAC 154 address space. Initially, the TPAC 154 is preset to an initial state, and the initial contents of the LFSM 102 are determined by the seeding of the LFSM 102. During each iteration of the inner write loop, the test circuitry writes the contents of the LFSM 102 in parallel fashion to the respective test point selected by the contents of the TPAC 154. For example, during the first iteration, the initial contents of the LFSM 102 are written in parallel fashion to the test point selected by the contents of the TPAC 154. During each subsequent iteration, a test clock signal 164 is provided to the LFSM 102 and to the TPAC 154. In write sub-mode, the LFSM 102 functions as a pseudorandom test pattern generator; the test clock 164 causes the LFSM 102 to transition from a present state into a subsequent state, such that the LFSM 102 is advanced by one state. Each test clock 164 also (causes the TPAC 154 to increment to the next test point. The updated contents of the LFSM 102 are then written to the incremented test point selected by the TPAC 154.

The steps of the write loop are repeated until all test points in the CUT have been addressed.

Once all test points in the CUT have been addressed in the write loop, each test point contains a valid stimulus. The BIST Control Unit 150 pulses the system clock 162 once to the various CUTs, latching data that has propagated through the circuitry under test to the next respective test point. The CUTs operate at frequencies up to full operating frequencies.

After data has been allowed to propagate from each respective test point through the CUT to the next respective test point and has been latched, the TPAC 154 is reset to its initial state. This resetting would occur preferably as a consequence of the BIST Control Unit 150 asserting a designated control signal. In other embodiments, the TPAC 154 returns to its initial state by virtue of having traversed its state space. This latter approach is considered more prone to error in design and therefore less desirable. The contents of the SSB 152 are restored to the LFSM 102, which then is said to contain the "Compaction Seed".

The invention (and in particular the LFSM 102 and TPAC 154) then enters read sub-mode, and iteratively reads all test points in an manner similar to that described above for write sub-mode. At the beginning of the read loop, the TPAC 154 is preset to an initial state, and the initial contents of the LFSM 102 are the compaction seed restored from the SSB 152. During each iteration, a test clock 164 is provided to the LFSM 102 and to the TPAC 154. Each test clock 164 causes the LFSM 102 to transition from a present state into a subsequent state, such that the LFSM 102 is advanced by one state. Upon each test clock 164 provided during the read loop, data is read from the test point addressed by the TPAC 154. This data is processed by the LFSM 102, that is, the data read from the test point is multiplexed into the exclusive-OR network of the LFSM 102 so as to deflect the trajectory of the LFSM 102 through its state space. Hence, in read sub-mode, the LFSM 102 functions as a multiple-input signature compactor. Each test clock 164 also causes the TPAC 154 to increment to the next test point.

The steps of the read sub-mode test loop are repeated until all test points in the CUT have been addressed.

Upon completion of the read sub-mode test loop, the contents of the LFSM 102, which now comprise a relatively unique signature which is stochastically determined from a) the Compaction Seed and b) the aggregate response obtained by interrogating the test points, are in some embodiments shifted out via scan for analysis.

The contents of the SSB 152 are then restored to the LFSM 102, which is then said to contain the "Pattern Generation Seed." The LFSM 102 is advanced by one state, the contents of the LFSM 102 are stored in the SSB 152, and the TPAC 154 is reset.

Additional execution of the write and read loops (and the intervening events) may occur in autonomous fashion. Each cycle of BIST includes the seeding of the LFSM 102 and resetting of the TPAC 154, the write sub-mode loop in which a stimulus is written to each test point in the logic under test, the single system clock pulse that allows data to propagate through the logic under test, and the read sub-mode loop in which response data is read from each test point in the logic under test and multiplexed into the LFSM 102. Autonomous operation continues indefinitely, or for as long as the time allocated for test will permit, or until a predetermined target for test coverage has been achieved, or until the LFSM 102 has traversed its full state space, or until a failure is detected.

The Normal Scan Mode of the test circuitry is now described. If the, Normal Scan Mode input 168 of the BIST Control Unit 150 is asserted through external intervention, the LFSM 102 functions as a normal scan register by means of multiplexer circuitry, with each cell's contents serially shifted to its nearest neighbor. No other logical operation is performed on the data as it is shifted. In addition, the address of the designed test point is written to the ABPReg 312 via the Scan Input 174 of the BIST Control Unit 150. Subsequently, the contents of the AEPReg 312 are written to the TPAC 154. The Normal Scan Mode permits the user to apply specific stimulus data to a specific test point(s) without relying on the LFSM 102 to generate that data and to retrieve response data from a specific test point or points without relying on the LFSM 102 to compact that data.

The Diagnostic Mode of the test circuitry is now described. If a failure is detected during response analysis in BIST mode, it will often be desirable to diagnose the failure for purposes of yield improvement or field failure analysis. The purpose of diagnosis is to determine the input stimulus that resulted in a fault, and the actual response of the CUT to that stimulus, and the address of the test point in question.

LBPReg and ABPReg are set to values of the LFSMC 314 and TPAC 154, respectively, known to have been reached after a failure. Each is then iteratively decremented in its own (nested) loop and BIST is rerun. Each iteration of the loop that returns a failure results in the decrementing of the inner loop and reexecution of BIST, until a PASS result is obtained. It is then known what values of the LFSMC 314 and the TPAC 154 are associated with the failure. This is accomplished in the following manner.

When the Diagnostic Mode input 166 of the BIST Control Unit 150 is asserted by external intervention, the LBPReg 316 is set to the value contained in the LFSMC 314 at the end of the previous, failing test. The user must then set the ABPReg 312 to a desired value, typically the maximum possible value of the TPAC 154. The LFSMC 314 and the TPAC 154 are then reset to zero.

BIST operation proceeds, with the LFSM 102 generating pseudorandom test stimuli and compacting response data, until the LFSMC 314 value equals the LBPReg 316 value AND the TPAC 154 value equals the ABPReg 312 value, at which time the BIST Control Unit 150 asserts the Test Complete output 172. This signals that the specified breakpoints have been reached, and the BIST Control Unit 150 halts the LFSM 102 and TPAC 154. The user may then assert Normal Scan Mode 168 and scan out the contents of the LFSM 102 for analysis. The user decrements the ABPReg 312.

The aforementioned procedure associated with the inner loop is repeated until BIST has executed with ABPReg 312 equal to zero. Then the user decrements the LBPReg 316 and resets the ABPReg 312 to the TPAC maximum value.

The aforementioned procedure associated with the outer loop is repeated until analysis of the response data returns a PASS result. At that point, the exact location of the stimulus resulting in a fault within the pseudorandom sequence is known, as is the exact location of the address of the test point containing the fault. The user may increment the ABPReg 312, rerun the test, and scan out the contents of the LFSM 102, the SSB 152, the ABPReg 312 and the LBPReg 316, from which the fault can be precisely determined.

Other embodiments of the invention will be apparent to those skilled in the art after considering this specification or practicing the disclosed invention. The specification and examples above are exemplary only, with the true scope of the invention being indicated by the following claims.

I claim the following invention:

1. An on-chip apparatus having logic under test and test circuitry, comprising:
   logic under test, having a plurality of test points, each test point having a plurality of nodes;
   a linear finite state machine (LFSM) having subsequent states that are non-sequential, pseudorandom binary numbers stochastically determined by a characteristic polynomial of the linear finite state machine, the contents of the linear state machine being readable or writable via scan; and
   a test data bus coupled between the logic under test and the linear finite state machine, the test data bus configured to convey data in parallel fashion between the linear finite state machine and the selected test point of the plurality of test points.

2. The apparatus of claim 1, wherein:
   the linear finite state machine is either a linear hybrid cellular automata, a tree structured linear cellular automata, or a linear feedback shift register; and
   the state-to-state transitions of the linear finite state machine are uniquely associated with a characteristic polynomial.

3. The apparatus of claim 2, wherein:
   the characteristic polynomial of the linear finite state machine is primitive and irreducible.

4. The apparatus of claim 1, further comprising:
   a seed storage buffer (SSB), coupled to the linear finite state machine in parallel fashion, the SSB having a first mode wherein the SSB is configured to archive data from the linear finite state machine and a second mode wherein the SSB is configured to restore data to the linear finite state machine.

5. The apparatus of claim 4, further comprising:
   a second seed storage buffer (SSB), coupled to the linear finite state machine in parallel fashion, the SSB having a first mode wherein the SSB is configured to archive data from the linear finite state machine and a second mode wherein the SSB is configured to restore data to the linear finite state machine.

6. The apparatus of claim 1, wherein:
   the LFSM is configured as a pseudorandom pattern generator.

7. The apparatus of claim 1, wherein:
   the LFSM is configured as a multiple input response compactor.

8. The apparatus of claim 1, further comprising:
   a second linear finite state machine, configured as a response data compactor, having subsequent states that are non-sequential, pseudorandom binary numbers stochastically determined by a second characteristic polynomial of the second linear finite state machine, such that when response data that is read from a selected test point of the plurality of test points is deliberately injected into the transition sequence by both multiplexers and exclusive-OR gates the state-to-state transitions are a stochastic function of both the characteristic polynomial and of the response data being read from the test point, the state-to-state transitions being a simple closed loop otherwise, the contents of the second linear state machine being readable or writable via scan.

9. The apparatus of claim 8, further comprising:
   a second seed storage buffer (SSB), coupled to the second linear finite state machine in parallel fashion, the SSB having a first mode wherein the SSB is configured to archive data from the second linear finite state machine and a second mode wherein the SSB is configured to restore data to the second linear finite state machine.

10. The apparatus of claim 1, further comprising:
    a Test Point Address Counter (TPAC), configured to select a test point belonging to the plurality of test points in the logic under test, the TPAC gating the selected test point to the test data bus; and
    a built-in self-test (BIST) control unit, configured to control whether data is written to or read from the selected test access point, and to control sequencing of the TPAC and the LFSM.

11. A system having a plurality of logic circuits fabricated on a plurality of chips within the system, comprising:
    logic under test fabricated on a chip of the system, the logic under test having a plurality of test points, each test point having a plurality of nodes;
    a linear finite state machine (LFSM) having subsequent states that are non-sequential, pseudorandom binary numbers stochastically determined by a characteristic polynomial of the linear finite state machine, the contents of the linear state machine being readable from or writable to the logic under test via scan, the linear finite state machine being fabricated on the same chip and of the same technology as the logic under test; and
    a test data bus coupled between the logic under test and the linear firite state machine, the test data bus configured to convey data in parallel fashion between the linear finite state machine and the selected test point of the plurality of test points.

12. The system of claim 11, wherein:
    the linear finite state machine is either a linear hybrid cellular automata, a tree structured linear cellular automata, or a linear feedback shift register; and the state-to-state transitions of the linear finite state machine are uniquely associated with a characteristic polynomial.

13. The system of claim 11, further comprising:
a seed storage buffer (SSB), coupled to the linear finite state machine in parallel fashion, the SSB having a first mode wherein the SSB is configured to archive data from the linear finite state machine and a second mode wherein the SSB is configured to restore data to the linear finite state machine.

14. The system of claim 11, wherein:
the LFSM is configured as a pseudorandom pattern generator.

15. The system of claim 11, wherein:
the LFSM is configured as a multiple input response compactor.

16. The system of claim 11, further comprising:
a second linear finite state machine, configured as a response data compactor, having subsequent states that are non-sequential, pseudorandom binary numbers stochastically determined by a second characteristic polynomial of the second linear finite state machine, such that when response data that is read from a selected test point of the plurality of test points is deliberately injected into the transition sequence by both multiplexers and exclusive-OR gates the state-to-state transitions are a stochastic function of both the characteristic polynomial and of the response data being read from the test point, the state-to-state transitions being a simple closed loop otherwise, the contents of the second linear state machine being readable or writable via scan.

17. The system of claim 11, further comprising:
a Test Point Address Counter (TPAC), configured to select a test point belonging to the plurality of test points in the logic under test, the TPAC gating the selected test point to the test data bus; and
a BIST control unit, configured to control whether data is written to or read from the selected test access point, and to control sequencing of the TPAC and the LFSM.

18. A method for fabricating a chip having built-in self-test (BIST) capability, comprising: fabricating logic under test on the chip, the logic under test having a plurality of test points, each test point having a plurality of nodes;
providing a linear finite state machine (LFSM) on the chip and of the same technology as the logic under test, the linear finite state machine having subsequent states that are non-sequential, pseudorandom binary numbers stochastically determined by a characteristic polynomial of the linear finite state machine, the contents of the linear state machine being readable or writable via scan; and
providing a test data bus coupled between the logic under test and the linear finite state machine, including configuring the test data bus to convey data in parallel fashion between the linear finite state machine and the selected test point of the plurality of test points.

19. The method of claim 18, wherein:
providing a linear finite state machine includes configuring the linear finite state machine as either a linear hybrid cellular automata, a tree structured linear cellular automata, or a linear feedback shift register, such that the state-to-state transitions of the linear finite state machine are uniquely associated with a characteristic polynomial.

20. The method of claim 18, further comprising:
coupling a seed storage buffer (SSB) to the linear finite state machine in parallel fashion, including configuring the SSB to have a first mode wherein the SSB is configured to archive data from the linear finite state machine and a second mode wherein the SSB is configured to restore data to the linear finite state machine.

21. The method of claim 18, wherein:
providing a linear finite state machine includes configuring the LFSM as a pseudorandom pattern generator.

22. The method of claim 18, wherein:
providing a linear finite state machine includes configuring the LFSM as a multiple input response compactor.

23. The method of claim 18, further comprising:
providing a second linear finite state machine on the chip and of the same technology as the logic under test, including configuring the second linear finite state machine as a response data compactor, having subsequent states that are non-sequential, pseudorandom binary numbers stochastically determined by a second characteristic polynomial of the second linear finite state machine, such that when response data that is read from a selected test point of the plurality of test points is deliberately injected into the transition sequence by both multiplexers and exclusive-OR gates the state-to-state transitions are a stochastic function of both the characteristic polynomial and of the response data being read from the test point, the state-to-state transitions being a simple closed loop otherwise, the contents of the second linear state machine being readable or writable via scan.

24. The method of claim 18, further comprising:
providing a Test Point Address Counter (TPAC), including configuring, the TPAC to select a test point belonging to the plurality of test points in the logic under test, the TPAC gating the selected test point to the test data bus; and
providing a BIST control unit, including configuring the BIST control unit to control whether data is written to or read from the selected test access point, and to control sequencing of the TPAC and the LFSM.

25. A method for using a chip having built-in self-test (BIST) capability, comprising:
controlling an operation of logic under test, the logic under test having a plurality of test points, each test point having a plurality of nodes;
generating non-sequential, pseudorandom binary numbers using a linear finite state machine (LFSM), including generating the non-sequential, pseudorandom binary numbers that are stochastically determined by a characteristic polynomial of the linear finite state machine;
selectably reading or writing the contents of the linear finite state machine via scan; and
conveying data, in parallel fashion between the linear finite state machine and the selected test point of the plurality of test points, over a test data bus coupled between the logic under test and the linear finite state machine.

26. The method of claim 25, wherein:
generating non-sequential, pseudorandom binary numbers includes using the linear finite state machine as either a linear hybrid cellular automata, a tree structured linear cellular automata, or a linear feedback shift register, such that the state-to-state transitions of the linear finite state machine are uniquely associated with a characteristic polynomial.

27. The method of claim 25, further comprising:

selectably configuring a seed storage buffer (SSB) in a first mode or a second mode;

archiving data from the linear finite state machine in parallel fashion when the seed storage buffer is in the first mode;

configuring the SSB to restore data to the linear finite state machine in parallel fashion when the SSB is in the second mode.

28. The method of claim 25, wherein:

generating non-sequential, pseudorandom binary numbers using a linear finite state machine includes generating non-sequential, pseudorandom binary numbers using a pseudorandom pattern generator.

29. The method of claim 25, wherein:

generating non-sequential, pseudorandom binary numbers using a linear finite state machine includes generating non-sequential, pseudorandom binary numbers using a multiple input response compactor.

30. The method of claim 25, further comprising:

generating non-sequential, pseudorandom binary numbers using a second linear finite state machine that is configured as a response data compactor, including generating non-sequential, pseudorandom binary numbers having subsequent states that are non-sequential, pseudorandom binary numbers stochastically determined by a second characteristic polynomial of the second linear finite state machine, such that when response data that is read from a selected test point of the plurality of test points is deliberately injected into the transition sequence by both multiplexers and exclusive-OR gates the state-to-state transitions are a stochastic function of both the characteristic polynomial and of the response data being read from the test point, the state-to-state transitions being a simple closed loop otherwise, the contents of the second linear state machine being readable or writable via scan.

31. The method of claim 25, further comprising:

selecting a test point belonging to the plurality of test points in the logic under test, including using a Test Point Address Counter (TPAC);

gating the selected test point to the test data bus; and controlling whether data is written to or read from the selected test access point, and to control sequencing of the TPAC and the LFSM, including using a BIST control unit.

32. The method of claim 25, further comprising:

manipulating breakpoints in a methodical fashion so as to determine precisely the stimulus, response and address of a fault.

* * * * *